United States Patent [19]

Henshaw et al.

[11] 4,407,712

[45] Oct. 4, 1983

[54] HOLLOW CATHODE DISCHARGE SOURCE OF METAL VAPOR

[75] Inventors: William F. Henshaw, Street; John R. White, Darlington; Andrus Niiler, Bel Air, all of Md.

[73] Assignee: The United States of America as represented by the Secretary of the Army, Washington, D.C.

[21] Appl. No.: 383,882

[22] Filed: Jun. 1, 1982

[51] Int. Cl.³ ..................... C23C 13/12; C23C 15/00
[52] U.S. Cl. ............................. 204/298; 204/192 N; 118/723; 118/726; 118/50.1; 250/426; 313/346 DC
[58] Field of Search ............ 204/192 N, 298; 118/723, 726, 50.1; 250/426; 313/346 DC

[56] References Cited

U.S. PATENT DOCUMENTS

| | | | |
|---|---|---|---|
| 3,404,084 | 10/1968 | Hamilton | 204/298 |
| 3,491,015 | 1/1970 | Naff | 204/298 |
| 3,830,721 | 8/1974 | Gruen et al. | 204/298 |
| 3,836,451 | 9/1974 | Snaper | 204/298 |
| 4,094,764 | 6/1978 | Boucher et al. | 204/298 |
| 4,197,175 | 4/1980 | Moll et al. | 204/192 R |
| 4,254,159 | 3/1981 | Pulker et al. | 427/38 |
| 4,321,126 | 3/1982 | Kieferle et al. | 204/298 |
| 4,346,123 | 8/1982 | Kaufmann | 427/38 |
| 4,351,855 | 9/1982 | Pinkhasov | 427/37 |

FOREIGN PATENT DOCUMENTS 2949121  6/1980  Fed. Rep. of Germany ...... 204/298

OTHER PUBLICATIONS

T. Spalvins, "Survey of Ion Plating Sources," *J. Vac. Sci. Technol.*, vol. 17, pp. 315-321 (1980).

*Primary Examiner*—Aaron Weisstuch
*Attorney, Agent, or Firm*—Robert P. Gibson; Anthony T. Lane; A. Victor Erkkila

[57] ABSTRACT

A hollow cathode discharge device is disclosed for ion plating a substrate with high temperature metal vapor. A hollow cathode tube is adapted to receive pellets of the high temperature metal at a short location from the cathode tube opening which is selected to correspond to a temperature peak along the length of the cathode tube. The temperature peak is a characteristic of the cathode diameter and gas flow rate in the tube. Inert gas is supplied to the tube and, the tube may be shielded and provided with a constriction at its end opening. An anode is spaced from the cathode tube opening and power supply is provided for supplying a negative bias to the cathode tube and a positive bias to the anode.

8 Claims, 4 Drawing Figures

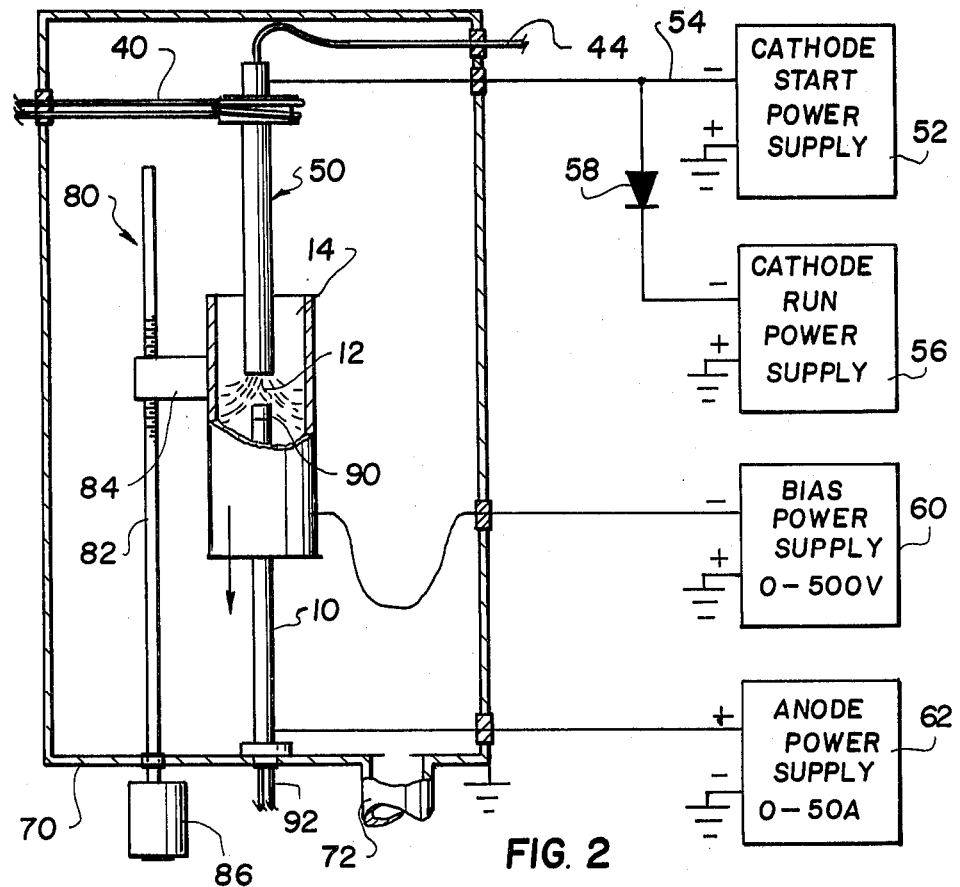
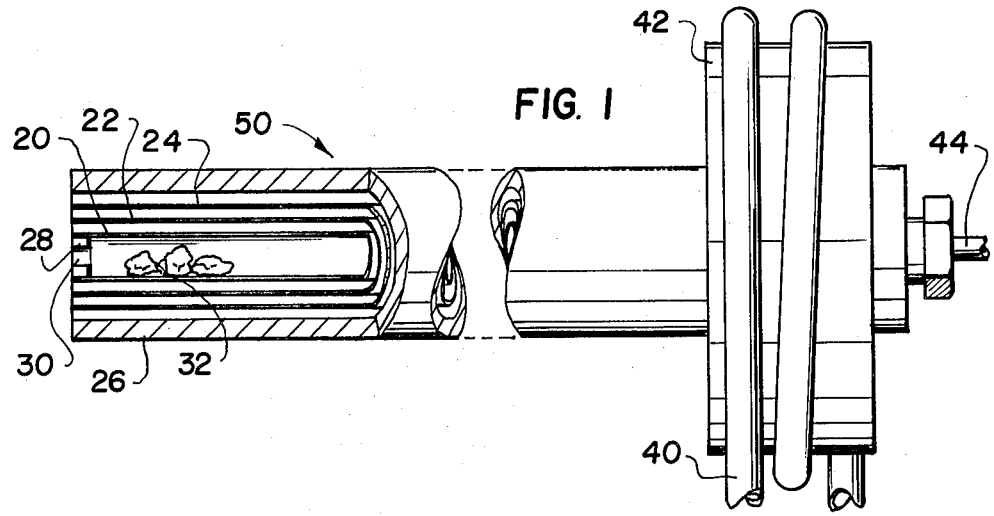

HOLLOW CATHODE DISCHARGE SOURCE OF METAL VAPOR

GOVERNMENT INTEREST

The invention described herein may be manufactured, used, and licensed by or for the Government for Governmental purposes without the payment to us of any royalties thereon.

FIELD AND BACKGROUND OF THE INVENTION

The present invention relates in general to physical ion deposition devices, and in particular to a new and useful hollow cathode discharge vapor source for providing high melting temperature metal vapors for ion plating the inside surfaces of cylinders.

Physical vapor deposition (PVD) is a process in which a substance, usually a metal, is deposited onto the surface of an object called the substrate. The two most common forms of PVD are evaporation and sputtering. In the former case, the metal vapor is produced by evaporation of the material to be deposited. This process is carried out at low pressures (less than $10^{-5}$ Torr) and produces a line of sight coverage on the substrate causing shadowed areas not to be covered. The material to be evaporated must have a melting point low enough to be attained by resistive heating in an evaporation boat. For materials having a higher melting temperature, the latter form of PVD must be used. In this case, the metal vapor is produced by inert gas ions striking a target of the plating material and knocking (sputtering) atoms from its surface. This process takes place at higher pressures ($10^{-3}$ Torr) which eliminates much of the shadowing present in evaporation, but has the disadvantage of having very low deposition rates, typically 100 Å/min.

In the last decade, a third form of PVD called Ion Plating has been developed and characterized. PVD is known as ion plating when a negative bias is applied to the substrate during deposition which is carried out in the presence of an inert gas such as Argon. The negative bias ionizes the vapor of deposition material and inert gas, thereby producing an acceleration of these ions toward the substrate. This action sputter cleans the substrate during deposition as well as physically mixes the substrate material with the deposited material. When the deposition rate is greater than the sputtering rate, a film is formed having adhesion properties far superior to those produced by the evaporation or sputtering methods. Ion plating is further characterized by a high pressure operation ($10^{-1}$–$10^{-2}$ Torr) which, because of the short mean free paths of the ions in the gas, provides excellent coating uniformity for irregularly shaped substrates. The high pressure operation of ion plating requires a deposition source capable of high metal vapor pressures.

The most commonly used vapor deposition source consists of a tantalum or tungsten boat which is resistively heated. The evaporation boat works well with low melting temperature metals but has several drawbacks. The first is that the melted metal may alloy with the boat, requiring frequent boat replacement. Another drawback is that the hot boat produces large amounts of heat which cannot be shielded without seriously affecting the ability to produce high metal vapor pressures. This heat requires the substrate to be placed at a considerable distance from the boat, reducing the coating efficiency. In addition, the boat must be connected to massive stationary electrical contacts necessary to carry the large currents needed (several hundred amperes), making the evaporation boat an essentially planar device.

When the material to be evaporated has a high melting temperature, an electron beam gun is used as the vapor source. The e-beam gun consists of an electron emitting filament, a magnet and a water cooled crucible. In operation, a current is run through the filament which is held at a potential of several thousand volts below the crucible. The emitted electrons are accelerated by this potential, bent and focussed by the magnet, and then strike the evaporant in the crucible causing it to melt and vaporize. The e-beam gun has an advantage over the evaporation boat in that less heat is generated, which allows the substrate to be closer to the vaporization source. Its major drawback is that the large filament potentials limit its use to pressures below $10^{-4}$ Torr. This makes it necessary to construct a complicated differential pumping system for use at the higher pressures required for ion plating. Consequently, its use is limited to a planar configuration as was the case with the evaporation boat.

Such conventional ion plating sources such as the electron-beam gun or the evaporation boat work well with geometries which are essentially planar. A large three dimensional object can be ion plated using multiple sources or a mechanism to rotate the substrate during deposition. These methods fail when trying to apply a uniform ion plated coating on the inside surfaces of tubes having a large length to inside diameter ratio.

The need for coating the inside of tubes has recently resulted in a system for sputtering in cylindrical coordinates. This system consists of a rod of the deposition material inserted coaxially inside a tube. Application of a potential of several thousand volts to the rod causes it to be sputtered, with the resulting atoms deposited on the substrate. This method has two major drawbacks. The deposition rate is very slow, with approximately 24 hours of continuous operation necessary to produce a reasonably thick coating ($10\mu$ meters), and it is believed that the material is sputter deposited rather than ion plated, and therefore would not have the good adhesion properties of an ion plated film.

SUMMARY OF THE INVENTION

The present invention comprises a hollow cathode arc metal vapor source which operates efficiency in the pressure range required for ion plating. The heat produced by the inventive source is much less than that produced by conventional sources, which permits the substrate to be very close to the vapor source and consequently provides high efficiency with regard to the amount of material deposited compared with the amount of material vaporized. The invention is particularly adapted for use in ion plating the inner surface of hollow members such as cylinders. The confined nature of the system causes the efficiency of the inventive device to be approximately 100%. In addition, the hollow cathode has a long lifetime when used with high melting temperature material such as chromium.

The power supply requirements for the inventive hollow cathode vapor source are simplified in that neither the high voltages needed in electron beam-guns, nor the high currents needed in evaporation boats are required.

The inventive vapor source also is applicable to a planar configuration or a cylindrical configuration with few constraints on the length to diameter ratio.

Accordingly, an object of the present invention is to provide a device for ion plating a substrate with a high temperature metal vapor comprising, a hollow cathode tube having an end opening and adapted to receive the high temperature metal at a selected distance from said opening, gas supply means connected to the cathode tube for providing a gas therethrough and out the end opening, an anode spaced from the opening and power supply means connected to the cathode and anode for biasing the cathode with respect to the anode to produce an arc therebetween to vaporize the high temperature metal in the cathode, the selected distance chosen to correspond to a location of maximum temperature which is chacteristic of the cathode diameter bias.

A further object of the invention is to provide a constriction in the hollow cathode tube adjacent its open end.

A still further object of the invention is to provide such a device which includes at least one additional hollow tube surrounding the cathode tube for shielding the cathode tube, and means for cooling the shield.

A still further object of the invention is to provide a device for ion plating utilizing a hollow cathode tube which is simple in design, rugged in construction and economical to manufacture.

The various features of the novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

BRIEF DESCRIPTION OF THE DRAWINGS

In the drawings:

FIG. 1 is a side elevational view of the inventive hollow cathode tube device with portions cut away;

FIG. 2 is a schematic representation of the device of FIG. 1 in use;

DESCRIPTION OF THE PREFERRED EMBODIMENT

Figure 4:
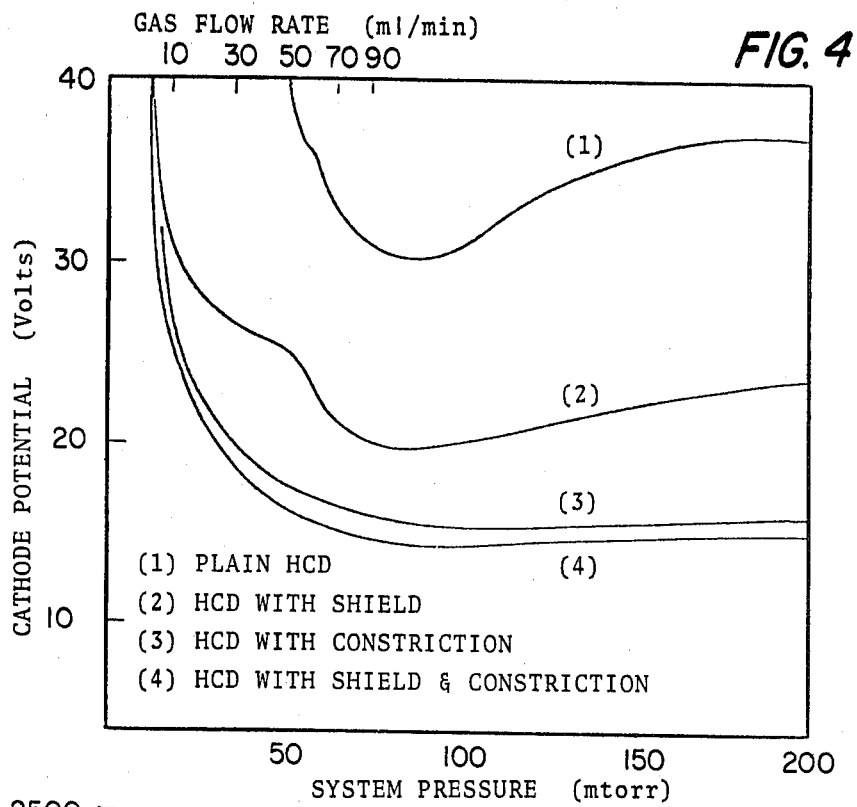
FIG. 4 is a graph representing the cathode potential vs. gas flow rate for different arrangements of the hollow cathode discharge device.

Referring to the drawings in particular, the invention embodied therein in FIG. 1 comprises a hollow cathode tube assembly generally designated 50. This cathode tube assembly is used, in accordance with FIG. 2, with an anode 10 to produce a spray of evaporated high temperature metal 12 which coats the inner surface of a substrate 14. In accordance with the invention, the substrate is conveniently a hollow member, in particular a cylinder, which advantageously receives the high temperature metal layer in an efficient manner.

As shown in FIG. 1, the cathode tube assembly 50 comprises an inner hollow cathode tube 20 made of tantalum and, in an embodiment shown, having an inside diameter of 3.2 mm and a wall thickness of 0.25 mm.

Two additional thin wall tantalum tubes designated 22 and 24 concentrically surround the cathode tube 20. These act as radiation sheilds, having a wall thickness of 0.5 mm and diameters of 6.4 and 9.5 mm, respectively.

The cathode tube arrangement is provided with an outer thick walled shield in the form of a copper tube 26 having an outside diameter of 12.7 mm in the embodiment shown.

The length of this assembly is tailored to the length of the substrate to be coated and, in the example shown, is 25 cm.

In accordance with one feature of the invention, a tantalum constriction 28 may be provided in the cathode tube opening 30 to reduce the inside diameter of the opening to about 2 mm. The use of this optional constriction allows a high current hollow cathode arc to be established quickly and at lower gas flow rates. This corresponds to lower system pressures. The constriction, however, has the disadvantage of reducing the amount of material which can be vaporized per load.

The high temperature metal to be vaporized, designated 32, is positioned in the cathode tube 20. The positioning of the material is important since, when a hollow cathode is in a high current mode of operation, a temperature profile is established inside the tube. This profile is characterized by a peak which may reach 2,500° C. at some distance away from the cathode opening 30. The exact location of the temperature peak varies with the cathode diameter and gas flow rate. The high temperature metal or evaporant 32 should be centered near this temperature peak. For the cathode without the optional constriction, the evaporant can be placed anywhere between $\frac{1}{2}$ cm from the opening to 3 cm within the tube. When using the constriction 28, the evaporant should extend no further than 2 cm within the tube. Placing the evaporant at the $\frac{1}{2}$ cm limit ensures that it leaves the tube as a vapor and eliminates a "spitting" problem where non-evaporated liquid droplets of the high temperature metal are ejected through the opening 30. The 3 cm limit ensures that the evaporant will be completely evaporated. When these criteria are met, the cathode can be reloaded and used continuously without any known limit on its life expectancy.

Figure 3:
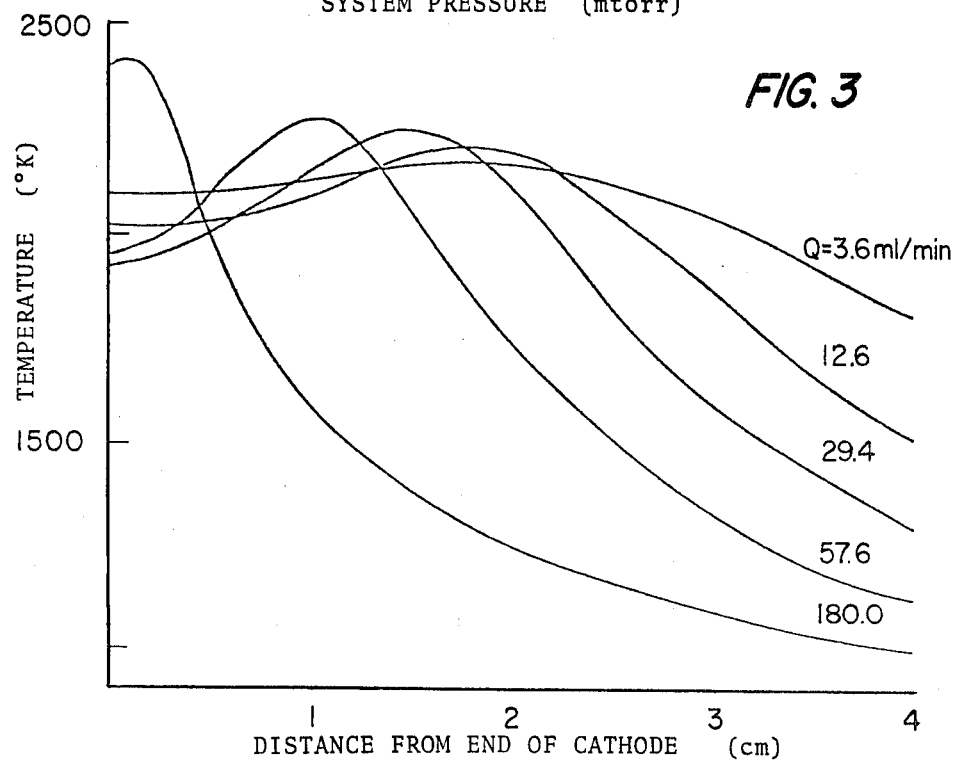
FIG. 3 is a graph representing an optimum distance from the hollow cathode tube opening for the positioning of high temperature metal to be evaporated.

The maximum temperature peak point for various gas flow rates is shown in FIG. 3, where the value Q represents the flow rate of argon in milliliters per minute.

Due to the high temperatures involved, the cathode tube arrangement 50 is cooled using for example, a cooling coil 40 for supplying cool water to a cylindrical copper element 42 which is connected to the copper shielding tube 26 to transfer therefrom. The gas used in the ion plating process is supplied via a gas conduit 44 to the interior of the cathode tube 20.

In operation, and as shown in FIG. 2, after the cathode tube 20 is loaded with a supply of high temperature metal pellets, such as chromium, at the advantageous location indicated above, a relatively high voltage low current negative bias is provided by a power source 52, to the cathode assembly 50 via conductor 54. During this startup period, argon gas is supplied via gas conduit 44 at a relatively high rate of 100 millitorr. After an arc is struck between the cathode and anode 10, the negative biasing of cathode 50 is switched over to a power source 56 which provides power at low voltage and high current to maintain the arc. At the same time, the argon gas flow is reduced to a lower pressure of a few millitorr and a corresponding lower flow rate.

Diode 58 is provided for isolating the power supply 52 from the power supply 56 during the startup period. In known fashion, the substrate 14 is provided with a negative bias by a power source 60 and the anode provided with a positive bias by power supply 62.

The ion plating apparatus itself is contained within a vacuum chamber 70 having an outlet 72. The substrate 14 can be moved past the evaporant source by suitably provided substrate transport means generally designated 80, which in the embodiment shown simply comprise threaded spindle 82 threadably engaged into a port 84 that is connected to the substrate 14. Spindle 82 can be rotated at a desired rate by a motor 86.

Since the anode 10 is also exposed to a high temperature condition, it is provided with a tantalum cap 90 and may also be provided with a separate water cooling apparatus shown at 92. While it is not essential to water cool the anode, it has been found that better films are produced if the anode is water cooled since this will result in cooler substrate temperatures.

The power supply 52 for startup typically supplies up to minus 600 volts at 2 amps and the power supply 56 typically provides up to minus 100 volts at 50 amps.

FIG. 4 shows typical cathode potentials used, after startup, with typical gas flow rates for the hollow cathode tube alone (1), the cathode tube plus shielding (2), the cathode tube plus the constriction (3) and the cathode tube with the shielding and constriction (4).

Typical cathode to anode current after startup is 15 amps with a gas flow rate of 4 milliliters per minute. This provides a system pressure of 10 millitorr. The substrate is biased at minus 250 volts. The anode power supply 62 must be capable of accommodating the current requirement and typically is capable of producing up to 50 amps current.

The relatively low substrate bias is a major point of departure from the bias of several kilovolts used in conventional ion plating. This is reasonable since planar geometries require pressures orders of magnitude higher than required in the present invention, in order to cause some of the atoms sputtered from the substrate to be returned to it through atomic collisions and thus forming a graded film substrate interface. In high pressure systems, the average energy of the atoms striking the substrate is approximately 5% of the bias voltage, due to the short mean free path. The average energy of the atoms at the lower pressures used in this invention is closer to the bias voltage due to the long mean free path in absence of a glow discharge around the substrate. The concentric cylindrical arrangement of the invention also takes advantage of the confining nature of the arrangement to give a high probability of a sputtered atom being returned to the substrate.

Typical plating rates of 1 μm per minute at 10 millitorr pressure have been observed.

In greater detail, the startup operation proceeds as follows:

After achieving a base pressure in the container 70 of less than 1 millitorr, argon is introduced into the system through gas feed tube 44 at a rate of several hundred milliliters per minute. The system pressure then rises to about 300 millitorr. The cathode potential is increased until a hollow cathode discharge is observed which occurs at a potential of about 200 volts with a current less than 1 amp. Approximately one minute later, the cathode will be hot enough to cause thermionic emission and consequently switches to a hollow cathode arc. The cathode current and voltage at this stage are typically 2 amps at 80 volts. The current can now be increased (15 to 25 amps) with the cathode run power supply. When the gas flow rate is reduced to between 4 and 50 milliliters per minute, the pressure decreases to between 10 millitorr and 100 millitorr and a brilliant blue glow of excited chromium atoms can be observed streaming from the cathode opening 30. Slowly sweeping the cylindrical substrate 14 coaxially over the cathode-anode gap 12 will result in a uniform chromium plating on the inner surface of the substrate. A 4 cm diameter tube swept at a rate of 3 cm per minute will typically result in a 1 μm chromium film.

While a specific embodiment of the invention has been shown and described in detail to illustrate the application of the principles of the invention, it will be understood that the invention may be embodied otherwise without departing from such principles.

What is claimed is:

1. A device for ion plating a substrate with high temperature metal vapor comprising:
   an evacuable chamber enclosing;
   a hollow cathode tube having an end opening and adapted to receive a high temperature plating metal at a selected distance from said opening;
   gas supply means connected to said cathode tube for supplying a gas therethrough at a selected flow rate;
   an anode spaced from said cathode tube open end; and
   power supply means connected to said cathode tube and anode to bias said cathode tube negatively with respect to said anode sufficiently to produce an arc therebetween and evaporate the high temperature metal in said cathode tube;
   means for mounting a hollow substrate surrounding said cathode and anode; and power supply means for negatively biassing said substrate;
   wherein said selected distance is chosen to correspond substantially to a location of maximum temperature which is a characteristic of the inside diameter of said cathode tube and the gas flow rate supplied by said gas supply means.

2. A device according to claim 1, including a constriction in said hollow cathode tube at said opened end for reducing the inside diameter of said cathode tube at said open end.

3. A device according to claim 2, including cooling means connected to said at least one additional hollow tube for cooling said additional hollow tube.

4. A device according to claim 1, including at least one additional hollow tube surrounding and shielding said hollow cathode tube.

5. A device according to claim 1, wherein said hollow cathode tube comprises a thin walled tantalum tube, said at least one additional tube comprises a thin walled tantalum tube surrounding said hollow cathode tube, said device including an outer thick walled copper tube.

6. A device according to claim 1, wherein said selected distance is chosen to be between ½ and 3 cm.

7. A device according to claim 1, including means for supporting said hollow cathode tube and anode with a selected distance therebetween, and means for transporting said hollow substrate past said selected distance.

8. A device according to claim 1, wherein said power supply means comprise a first power supply for providing relatively high negative voltage at relatively low current to said cathode tube during a startup period, and a second power supply for supplying relatively low negative voltage at high current to said cathode tube during an operating period.

* * * * *